United States Patent [19]

Cooledge

[11] Patent Number: 4,583,169
[45] Date of Patent: Apr. 15, 1986

[54] METHOD FOR EMULATING A BOOLEAN NETWORK SYSTEM

[75] Inventor: Joseph T. Cooledge, Bellevue, Wash.
[73] Assignee: The Boeing Company, Seattle, Wash.
[21] Appl. No.: 490,173
[22] Filed: Apr. 29, 1983
[51] Int. Cl.$^4$ ............................................. G06F 15/20
[52] U.S. Cl. ................................................. 364/300
[58] Field of Search ................ 364/200 MS File, 300, 364/900 MS File, 136, 200

[56] References Cited

U.S. PATENT DOCUMENTS

| | | | |
|---|---|---|---|
| 3,753,243 | 8/1973 | Ricketts, Jr. et al. | 364/200 |
| 3,839,630 | 10/1974 | Olander, Jr. et al. | 235/156 |
| 3,878,514 | 4/1975 | Faber | 340/172.5 |
| 3,942,158 | 3/1976 | Dummermuth | 340/172.5 |
| 3,971,925 | 7/1976 | Wenninger et al. | 235/156 |
| 3,979,057 | 9/1976 | Katz et al. | 235/156 |
| 3,990,052 | 11/1976 | Gruner | 340/172.5 |
| 4,063,221 | 12/1977 | Watson et al. | 364/900 |
| 4,120,043 | 10/1978 | Su | 364/900 |
| 4,126,898 | 11/1978 | Spangler et al. | 364/900 |
| 4,156,917 | 5/1979 | Olander, Jr. et al. | 364/200 |
| 4,156,918 | 5/1979 | Olander, Jr. et al. | 364/200 |
| 4,163,387 | 8/1979 | Schroeder | 73/178 R |
| 4,165,534 | 8/1979 | Dummermuth et al. | 364/900 |
| 4,212,076 | 7/1980 | Conners | 364/200 |
| 4,281,390 | 7/1981 | Olander, Jr. et al. | 364/200 |

OTHER PUBLICATIONS

"MC14500B Industrial Control Unit Handbook", Vern Gregory & Brian Dellande, Motorola Semiconductor Products, Inc., 1977.

Primary Examiner—Raulfe B. Zache
Attorney, Agent, or Firm—James P. Hamley; Bernard A. Donahue

[57] ABSTRACT

Switches, manually operable to produce a desired logic signal level, are user assigned to represent the various variable inputs to a Boolean network. Indicators are user assigned to represent the logic state of outputs from the network. Process logic is user programmable to define the Boolean and sequential logic relationships between the assigned inputs and outputs. A visual display identifies to a user the input variable assigned to each switch and the logic output assigned to each indicator.

A user may analyze the operation of the Boolean network being emulated by monitoring output indicator status in response to logic level inputs selected by the switches.

9 Claims, 10 Drawing Figures

METHOD FOR EMULATING A BOOLEAN NETWORK SYSTEM

BACKGROUND OF THE INVENTION

The present invention pertains to the logic analysis art and, more particularly, to a method for emulating the response of a Boolean network control system.

The operation of an electrical circuit or system can often be described by combinational and sequential logic expressions. The mathematical expressions describing system operation may be defined by Boolean algebra, formulated in the nineteenth century by George Boole.

A particular example of a Boolean network is found in the commercial aircraft art. There, numerous monitoring systems on the aircraft provide binary status symbols representative of the condition of an airplane parameter, such as wheels up or down. These binary signals are processed in circuitry which then activates appropriate indicators or warning devices. Thus, a system might sound a warning horn if an engine throttle is retarded and the landing gear is up.

Many aircraft monitoring and indicating systems are quite complicated involving a large number of sensors, several indicators and complex logic circuitry for activating the indicators in response to the status of the sensors. It would be useful, therefore, to model such systems for the purpose of confirming proper logic operation, as well as for analysis of system faults.

Various analytical techniques have evolved for the purpose of analyzing, or modeling complex logic systems. Such techniques include Venn diagrams, truth tables and Karnough or Mahoney maps. These procedures are, however, grossly limited when more than five or six variables are considered. Each time one variable is added to an equation, the number of possible input combinations doubles. For example, a truth table with nine variables has 512 entries, whereas a truth table with 10 variables has 1,024 entries. A Mahoney or Karnough map cannot physically fit on a standard sheet of paper if more than about eight variables are involved.

SUMMARY OF THE INVENTION

It is an object of this invention, therefore, to provide an improved method for emulating a Boolean network system, which method is capable of accommodating multiple inputs and outputs and complex logic without the requirement for detailed mathematical analysis.

Briefly, according to the invention, a method for emulating a Boolean network system having a plurality of input variables and a plurality of logic controlled outputs includes the first step of providing a plurality of inputs, each input adapted to be identified with a user selected one of the input variables to the Boolean network system, each input further adapted to assume a user selected logic state. Next, a plurality of output indicators is provided, each output indicator being adapted to be identified with the user selected one of the logic controlled outputs of the Boolean network, and each indicator providing an indication of the logic state applied thereto. Finally, a logic control means is provided, the logic control means being programmable by a user to define a Boolean functional relationship between the user selected inputs and outputs such that the logic control means responds to the user selected logic states at the selected inputs to apply appropriate logic states to the selected outputs in accordance with the programmed Boolean functional relationship.

DETAILED DESCRIPTION OF THE PREFERRED EMBODIMENT

Figure 1:
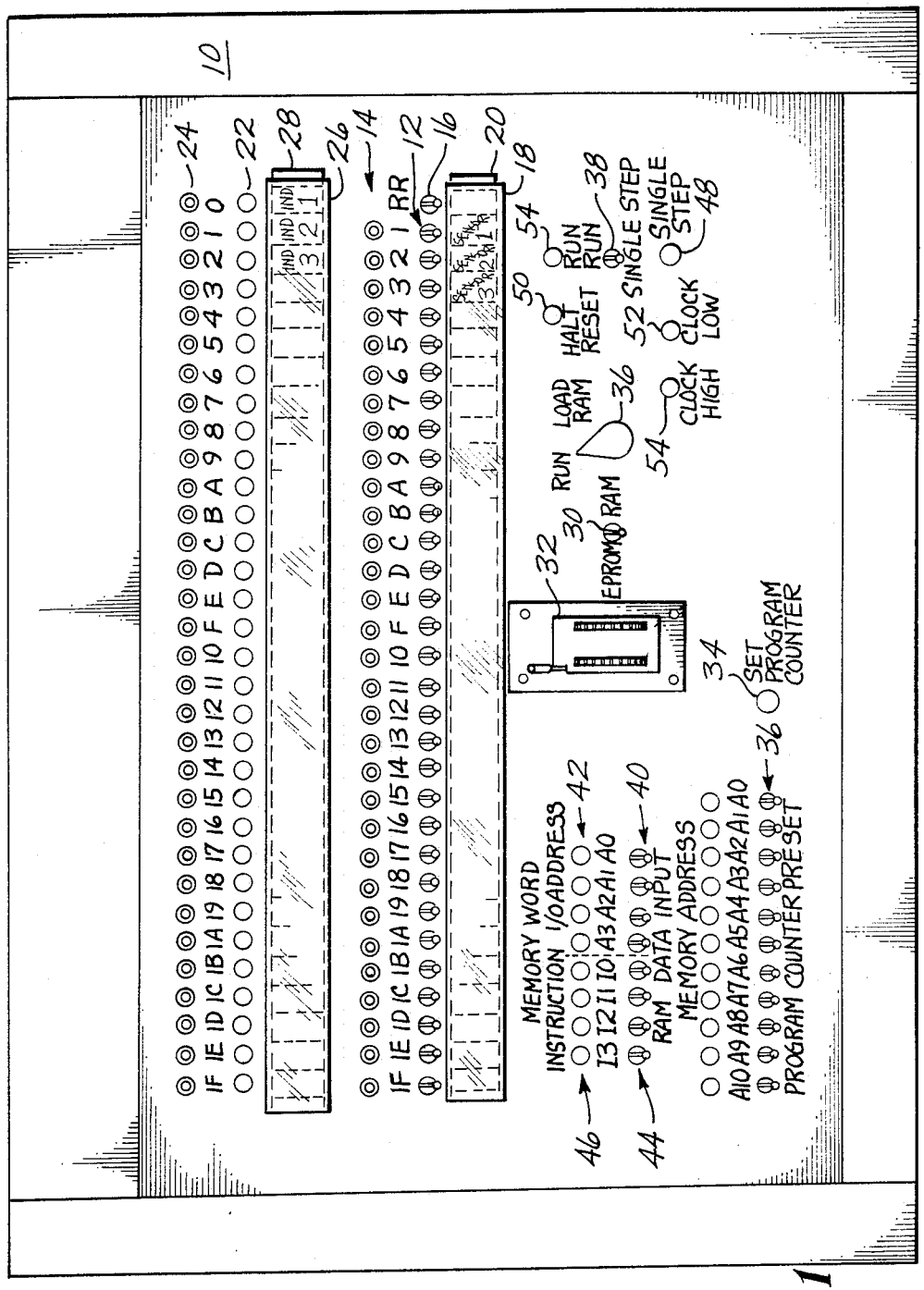
FIG. 1 illustrates the control panel layout used in accordance with the preferred emulating method.

FIG. 1 depicts a control panel, indicated generally at 10, which provides user control of the Boolean network emulating system.

Up to 31 input signal variables may be simulated via switch bank 12. Each switch within switch bank 12, in association with circuitry described with respect to FIG. 4, is actuable to one of two positions. One position represents a logic low or "false" level, a second represents a logic high or "true" level. The second position may also be used to transfer input control to a corresponding one of 31 jacks within jack bank 14. Through the use of jack bank 14, a user may apply as an input to the system any external signal.

In a manner described hereinbelow, additional inputs to the system may be provided from any system output. In addition, the result register (RR) associated with the central processing unit may be used as a system input, and its status is indicated by a light emitting diode (LED) indicator 16.

A transparent sleeve 18 aligned with the switch bank 12 is adapted to receive an insert 20. Insert 20 may be suitably marked by a user such that when it is received within sleeve 18, each input switch of switch bank 12 or jack of jack bank 14 is clearly associated with the sensor input it is simulating. Thus, insert 20 provides a convenient means for indexing each simulated input signal.

The emulating system is capable of addressing any one of 32 outputs. The status of each output is reflected by a corresponding LED within LED bank 22. Inasmuch as each output signal is binary, i.e., either a low or a high logic level, the corresponding LED may represent such levels by either being off on on, respectively.

Associated with each LED in the LED bank 22 is a corresponding jack in jack bank 24. The logic level appearing at each of the 32 outputs is coupled to a corresponding one of the output jacks 24, whereby this output may be directly coupled to external circuitry.

Aligned with the LED bank 22 is a sleeve 26 which receives an insert 28. Insert 28 may be suitably marked by a user such that when it is received within sleeve 26, each output LED of the LED bank 22, and jack of the jack bank 24 is labeled by the output it represents, thereby providing a convenient means for indexing each output.

Control of the processor within the emulating system is provided either by an Erasable Programmable Read Only Memory (EPROM) or by a Random Access Memory (RAM), as selected by a switch 30. In the event an EPROM is selected, the EPROM is received either within provided socket 32, or a suitable chassis socket.

If, however, an internal RAM is to be utilized, this RAM must first be programmed. Programming of the internal RAM is accomplished as follows. A pushbutton 34 labeled "SET PROGRAM COUNTER" is first depressed. This causes the addressing of the internal RAM to index to that value dictated by the PROGRAM COUNTER PRESET switch bank 36. An LED bank 38 associated with the PROGRAM COUNTER PRESET switch bank 36 indicates the memory being addressed within the RAM. At this point, a switch 36 is set in its "LOAD RAM" mode and a switch 38 is set in its "SINGLE STEP" mode. Switch 54 is depressed to set the "RUN" mode. Now, an input/output address, as set by switch bank 40, determines the input/output address to be stored within RAM. The status of the input/output address is reflected by a corresponding set of LED's 42. The operation code instruction to be stored in RAM is set by a switch bank 44, having corresponding status indicator LED's 46. The desired input/output address is selected by the user via switch bank 40, with the appropriate op-code being selected by switch bank 44 in accordance with the instruction being used. Once the appropriate input/output address and instruction codes have been selected by switch banks 40, 44, respectively, a "SINGLE STEP" button 48 is depressed, thereby entering the memory word into the RAM. At this point, the program counter increments to the next higher value, as indicated by the LED bank 38, and a new memory word is input via switch banks 40, 44. This process is repeated until the RAM is loaded with the desired program.

The user may then reset to the beginning of the program, via "SET PROGRAM COUNTER" switch 34 and, via activation of RUN pushbutton 54 and SINGLE STEP pushbutton 48, sequentially check the data stored in the RAM while observing program execution.

If it is desired to change (edit) the contents of one or more RAM locations, this is done by first setting the "PROGRAM COUNTER PRESET" switches 36 to the RAM address to be modified. Then the "SET PROGRAM COUNTER" switch 34 is pressed to vector the program counter to the preset address. Switch banks 40, 44, the RUN/LOAD RAM switch 36 and single step switch 38 are then used as described above to load new data.

A pair of LED's 52, 54 indicate to the user whether the system clock is at a "low" or "high" level, respectively. In this way, the LED's indicate to a user that information is being loaded into the RAM at the proper portion of the clock cycle, and that the system clock is functioning correctly.

Once a program has been entered into the system, either via an EPROM or a RAM, switch 36 is set to the RUN position, as is switch 38. By pushing a "RUN" button 54, a user then causes the system to apply the stored program to the system inputs as selected by input switch bank 12. The result is an activation of appropriate ones of the LED's in output LED bank 22. In this way, therefore, a user may simulate any desired input condition, program the system to emulate any desired Boolean network response, and monitor the corresponding output produced by the system. Thus, any Boolean network system may be quickly and accurately analyzed, and the result of any input fault conditions may be conveniently observed.

Use of the PROGRAM COUNTER PRESET switches provides the capability of storing multiple programs in memory, with each program beginning at a unique preset address.

Figure 2:
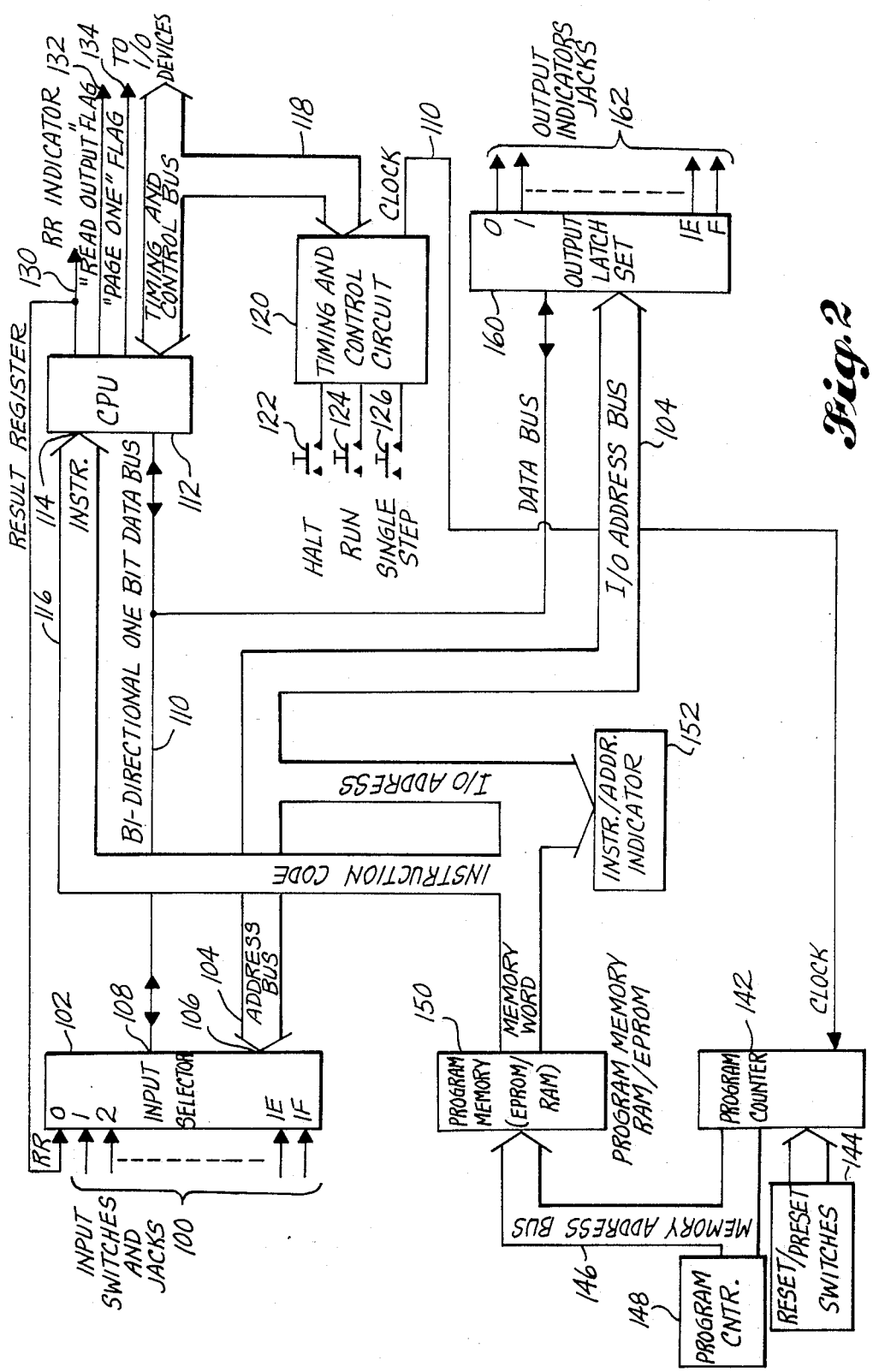
FIG. 2 is a block diagram illustrating the principle components, and their interconnections, in the preferred emulator construction.

FIG. 2 is a block diagram illustrating the principal components, and their interconnection, of the Boolean network emulator system. Here, each of the plurality of possible input signals is coupled over lines 100 to corresponding inputs of an input selector 102. Input selector 102 responds to an address signal being applied over address bus 104 at its address input 106 by coupling a suitable one of the input signals to the input selector output line 108. Output 108 is coupled to a bidirectional one-bit data bus 110 which connects to the Central Processing Unit (CPU) 112. CPU 112 either inputs or outputs data on data bus 110 in accordance with instruction code it receives at its input 114 carried over instruction bus 116.

Timing to the CPU 112, and to the input/output devices is provided over a timing and control bus 118 which is controlled by the timing and control circuit 120. The inputs to timing and control circuit 120 include the "HALT" switch 122, the "RUN" switch 124 and the "SINGLE STEP" switch 126.

CPU 112 also has an output line 130 corresponding to the status of its result register. As shown, the result register output is provided as an input to input selector 102. A "READ OUTPUT" flag 132 from CPU 112 is activated by CPU 112 when an output signal level is to be used as an input. In addition, a "PAGE 1" flag line 134 is activated by CPU 112 to expand the input/output capabilities, as is discussed below.

A clock signal, on clock line 140, is provided at the output of timing and control circuit 120. Clock line 140 connects to the clock input of a program counter 142. Control inputs to program counter 142 include the reset and preset switches 144. Program counter 142 is caused to vector to its preset level, as set by switches 144, in preparation to run a program. As the program is run, program counter 142 is incremented by clock signals on clock line 140 to thereby output memory address signals on a memory address bus 146. The status of the signals on the memory address bus 146 is indicated by program control indicators 148.

The memory address bus 146 connects to the input of the program memory 150, which may be comprised of either EPROM or RAM. In response to an address over memory address 146, the program memory 150 outputs an appropriate memory word comprised of an instruction code and an input/output address, as coupled over buses 116, 104 respectively. These signals are also coupled to instruction and address indicators 152.

The one-bit bidirectional data bus 110 and the input/output address bus 104 are both coupled to the output latch set 160. In response to the signal at the input/output address bus 104, output latch set 160, which connects to the output indicators via lines 162, activates an appropriate one of the output indicators. In the event an output signal is to be used as an input, as in sequential logic processing, the "READ OUTPUT" flag line 132 from CPU 112 causes the addressed output at output latch set 160 to be applied to the bidirectional one-bit data bus line 110. In this way, any desired output signal may be used as a sequential input.

The operation of the circuit of FIG. 2 may be understood as follows. In response to incrementing memory address signals on a memory address bus 146 from program counter 142, the program memory 150 outputs successive instruction codes on instruction code bus 116 and input/output addresses on address bus 104. The address signals on address bus 104 access either an input signal, via input selector 102, or a selected output via output latch set 160. The instruction code to the CPU 112 causes the CPU 112 to perform the commanded operation on either the input signal, selected via input selector 102 or produce the appropriate output signal, coupled to the output latch set 160. Thus, the system is capable of accepting any one of a large number of input variables, applying the variables to a stored Boolean relationship, and producing at output indicators the corresponding resultant of the logic operation.

Figure 3:
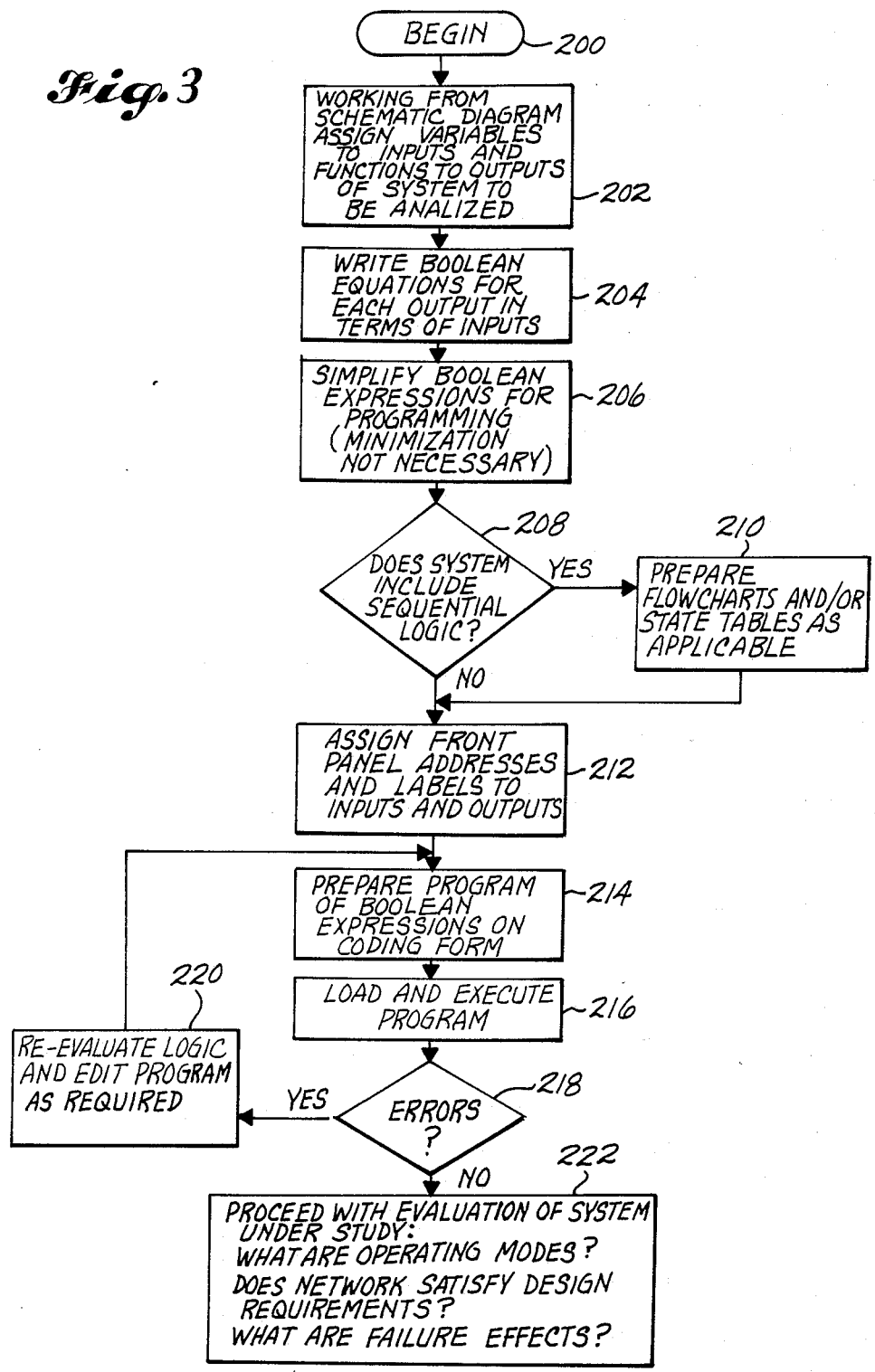
FIG. 3 is a logic flow diagram depicting the sequence of steps taken by a user in his operation of the preferred logic emulator; and, FIGS. 4A–4G are schematic diagrams of the preferred emulator construction.
Figure 4A:
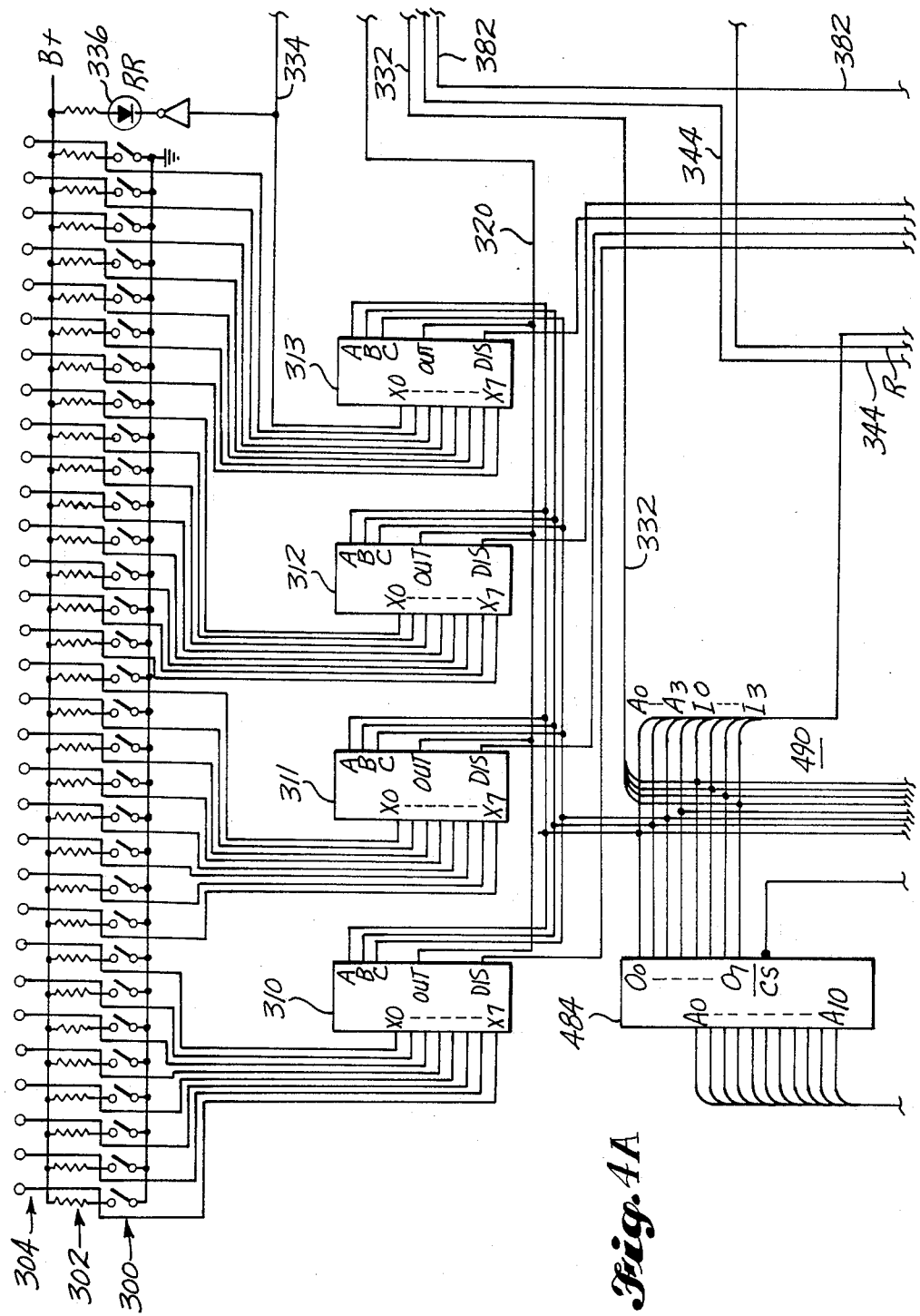
Figure 4B:
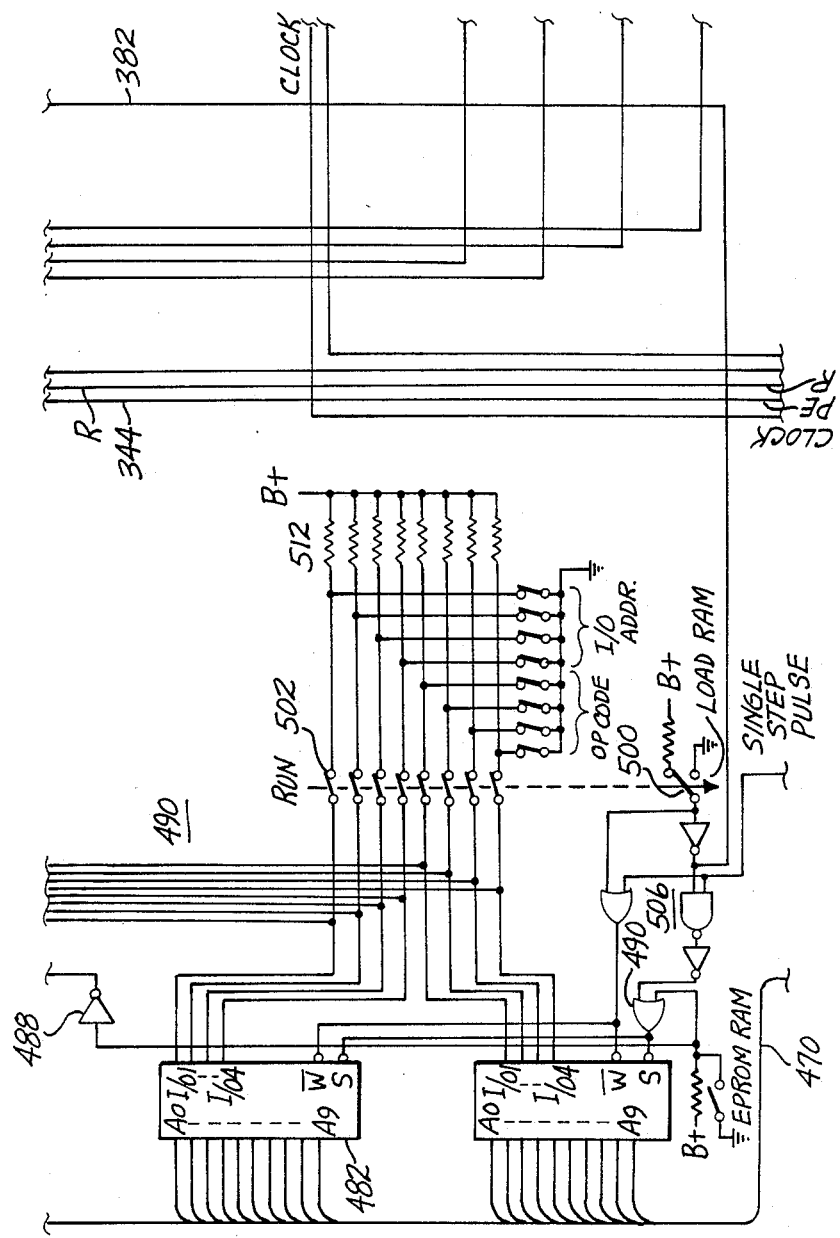
Figure 4C:
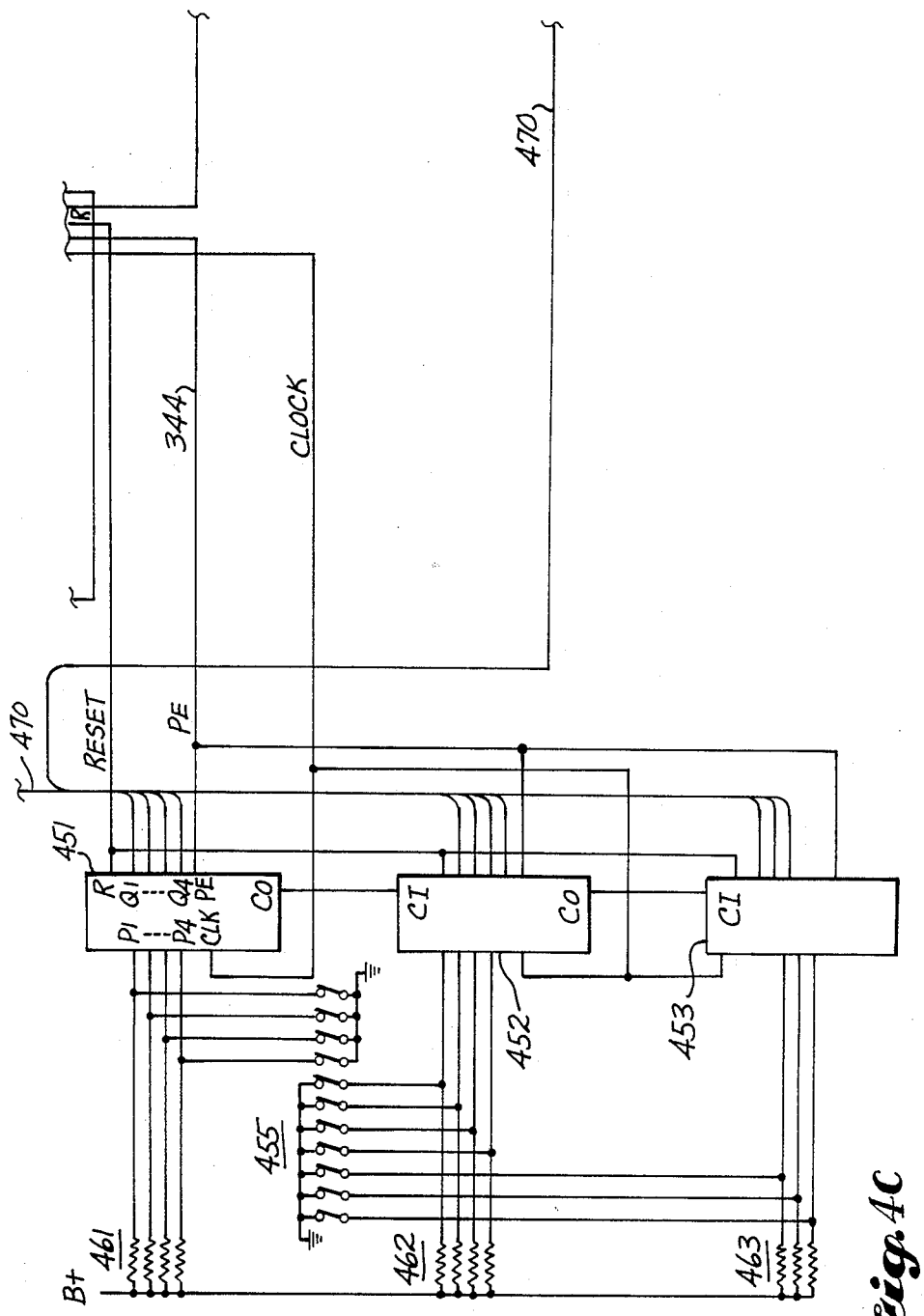
Figure 4D:
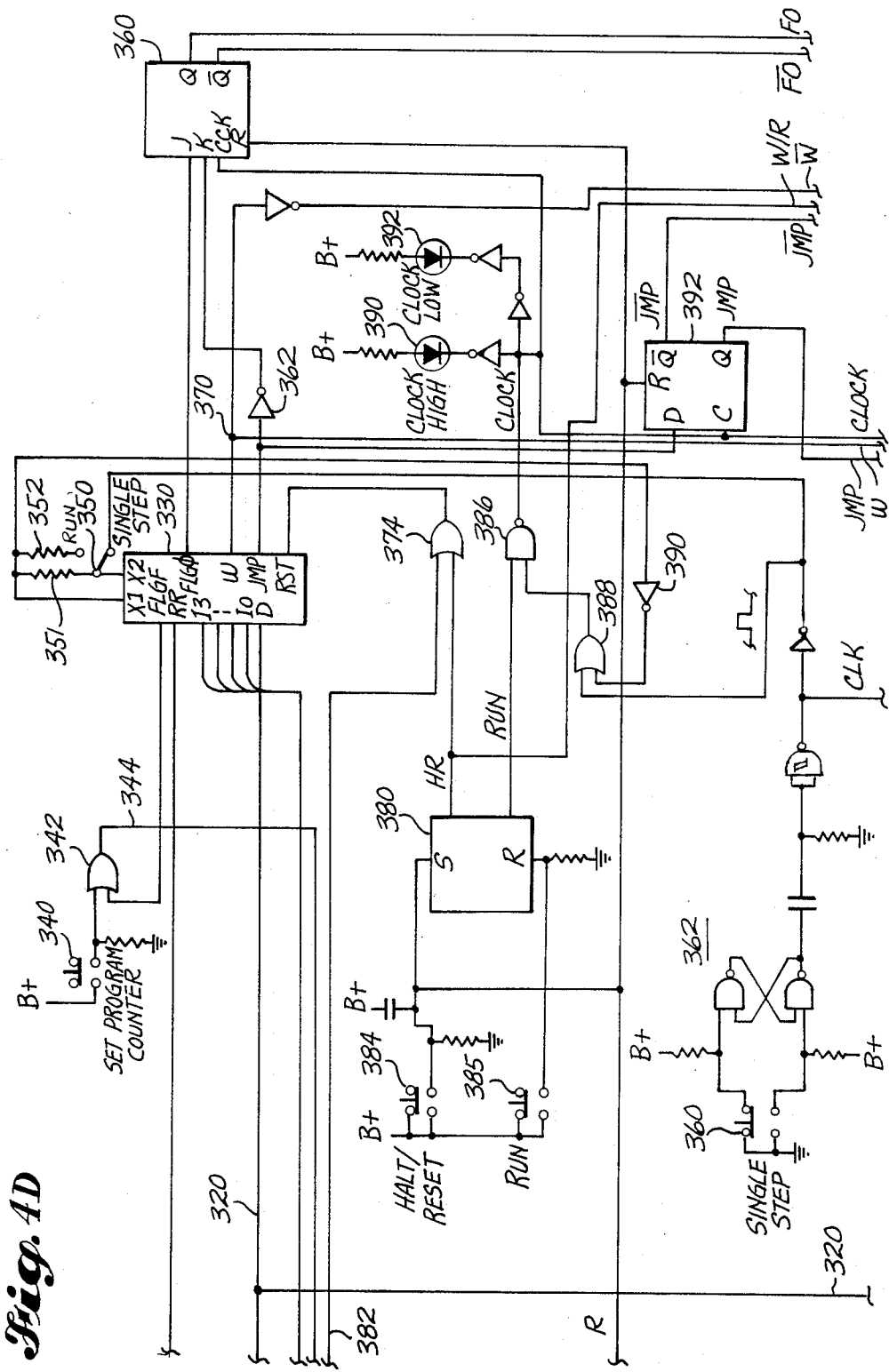
Figure 4E:
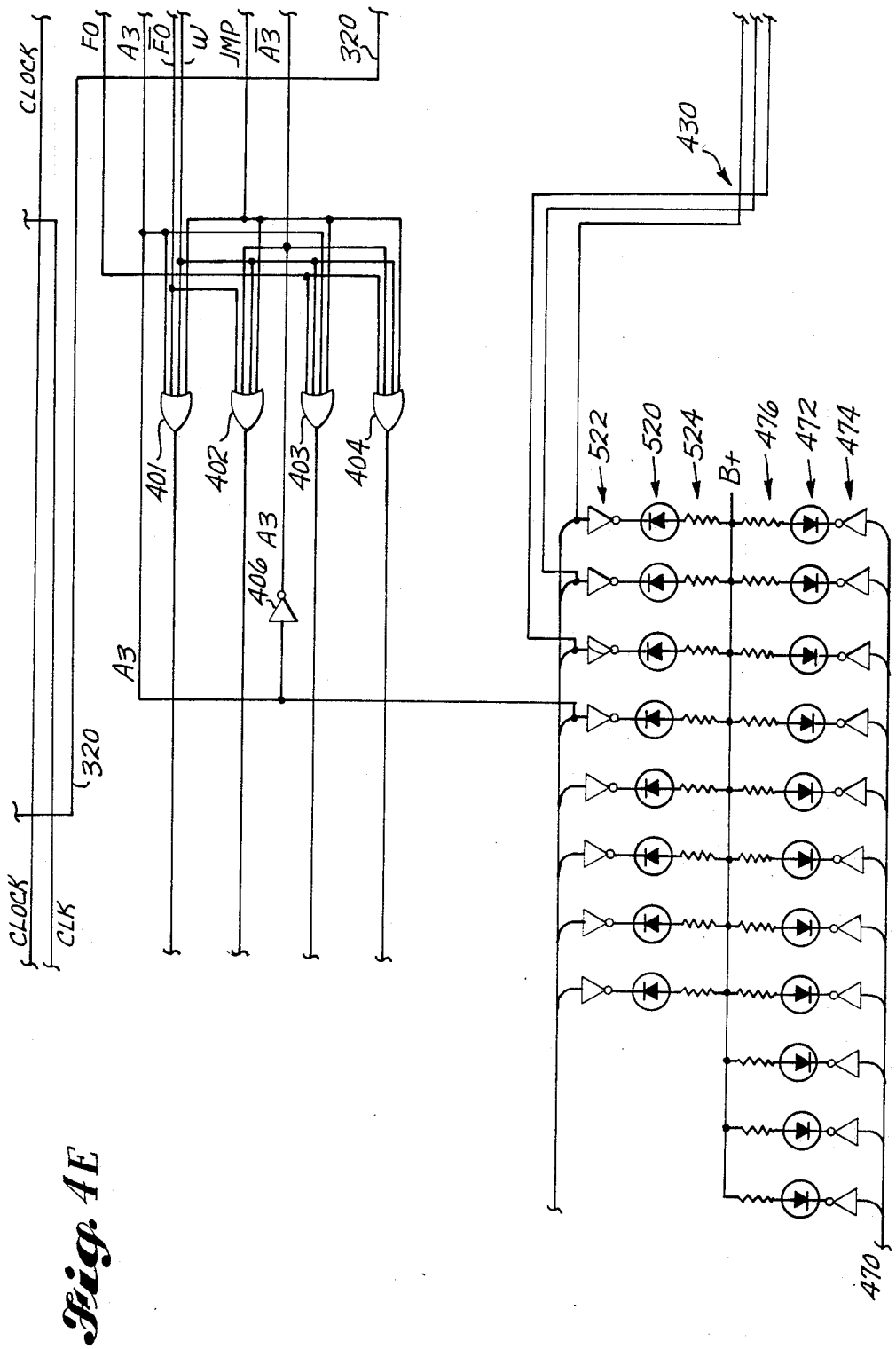
Figure 4F:
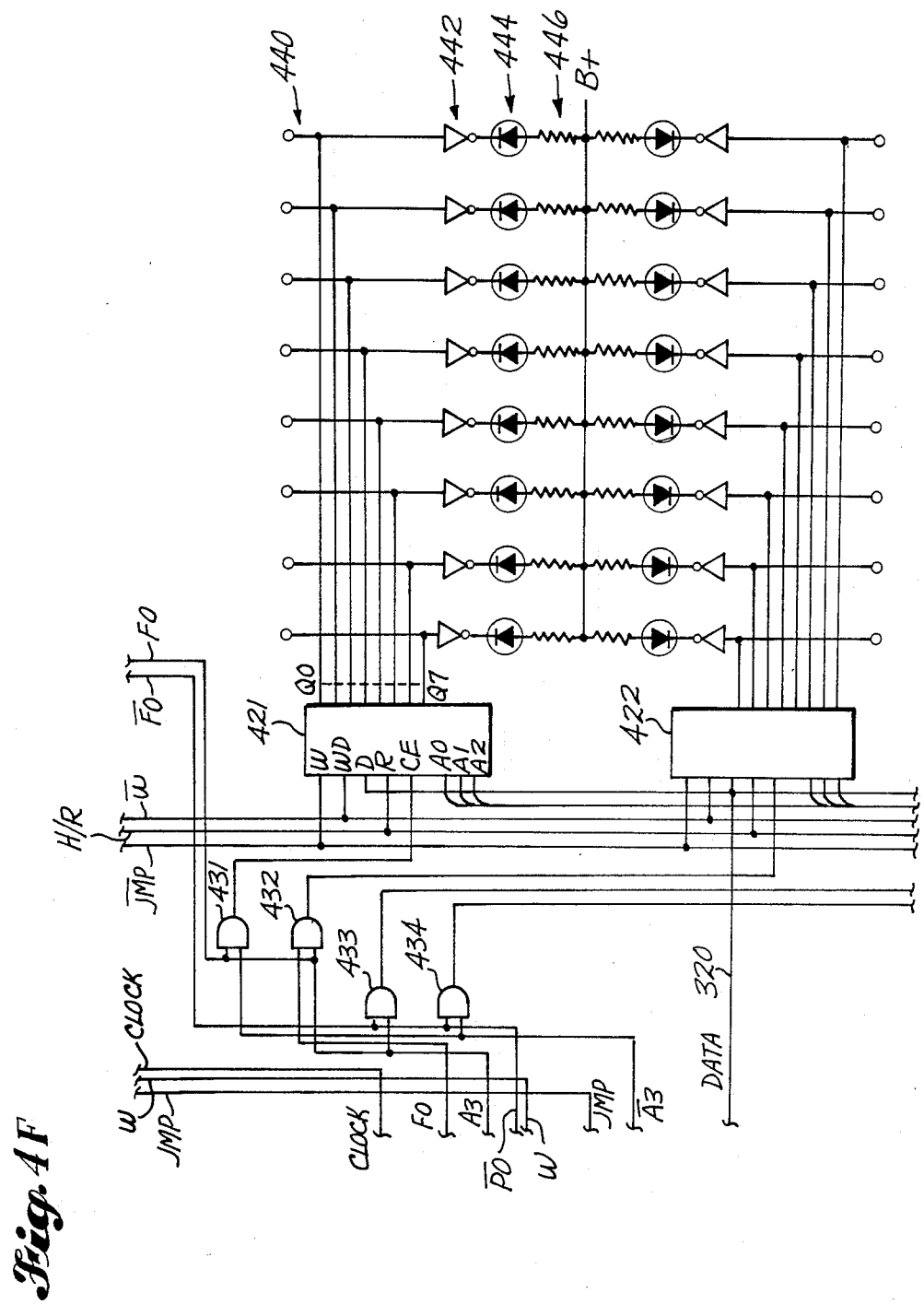
Figure 4G:
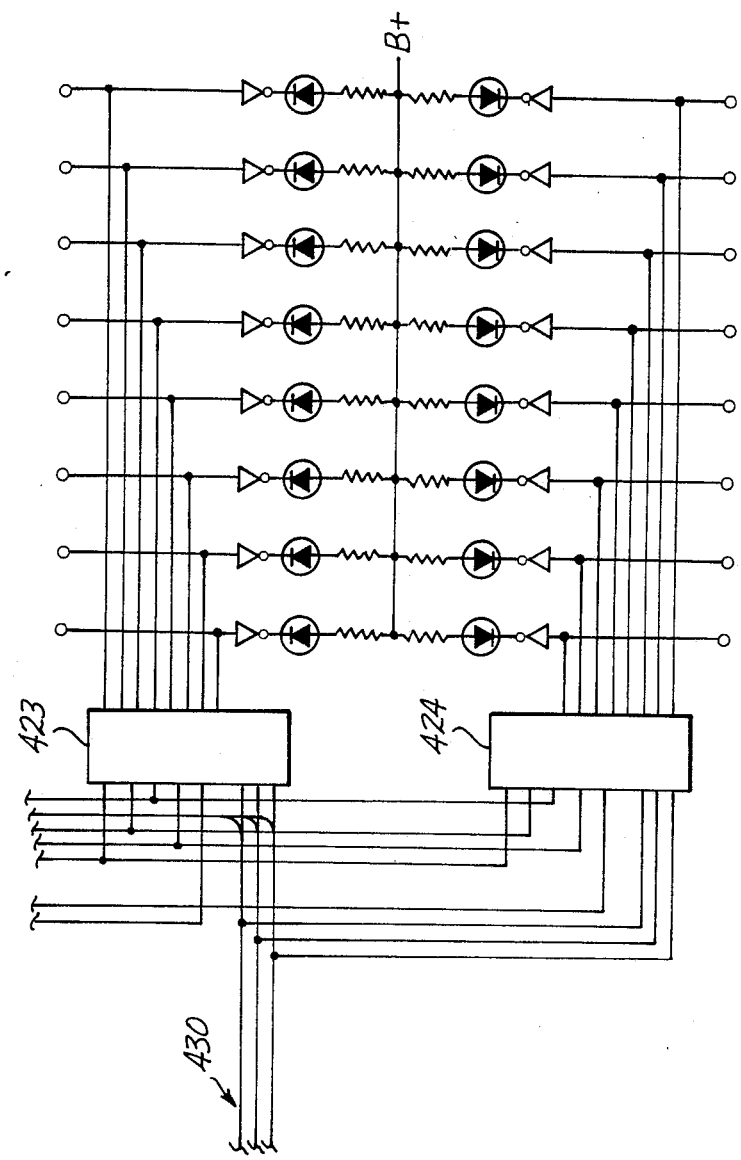

FIG. 3 is a logic flow diagram illustrating each step performed during the course of practicing the present emulation method.

The flow is begun at "BEGIN" block 200. Next, a user, working from a schematic diagram of the system to be emulated, assigns inputs, outputs, and the functional relationships therebetween, at block 202. Boolean equations for each output in terms of the inputs are then prepared at block 204. The Boolean expressions are simplified, at block 206, to reduce programming, but minimization of these expressions is not required.

It is then determined, at block 208, whether or not sequential logic will be used. If it is, suitable flow charts and/or state tables are prepared at block 210.

Following blocks 208, 210 a user assigns addresses and affixes suitable labels to the input switches and output indicators, at block 212. The Boolean expressions, prepared at block 206, are then converted to program language, suitable coding for the CPU being used, at block 214. The program is then loaded and executed at block 216. A test is done at block 218 to determine whether or not errors exist in the program as executed. If errors do exist, the program is edited at block 220 and thereafter returned to block 214. When the system is error-free, the operator may then fully analyze and diagnose the system responses, as indicated at block 222.

It will be seen that the emulation procedure, as outlined in FIG. 3, clearly reduces the need for a user to involve himself in a detailed traditional mathematical analysis of the system under study. As a result, the present emulator system is capable of high accuracy with minimum operator labor.

FIGS. 4A-4G are detailed schematic diagrams of the emulator system.

Here, each system input signal is controlled by a corresponding switch in a switch bank 300. When one of the switches in switch bank 300 is closed, a ground or logic zero ("false") level is produced as a signal input. With a switch open, however, a logic high ("true") level is coupled through a corresponding one of the resistors in a resistor bank 302. If, in this position, an external signal of appropriate amplitude is applied via an associated input jack in jack bank 304, this external signal is supplied as the signal input.

Successive input signals coupled via switch bank 300 are applied to successive inputs of four eight-channel data selectors 310-313. Referring to a channel data selector 310 (preferably a commercially available type MC 14512B integrated circuit) each data selector has eight inputs X0-X7, receiving the input signals, three data address lines A, B, and C, an output line "OUT" and a disable input "DIS". When a particular data selector, such as data selector 310, is enabled (i.e., not disabled) it responds by producing on its output line that signal appearing at an input X0-X7 as addressed by the address at inputs A-C. That selected one of the input signals, as routed through any of data selectors 310-313, is applied to the bidirectional one-bit data bus 320.

Bidirectional data bus 320 connects to the data input of the central processing unit 330, preferably comprised of a Motorola type MC 14500B integrated circuit. CPU 330 receives input operational code at its instruction inputs I0-I3 via a four-bit instruction bus 332. The Result Register (RR) in the one-bit processor 330 is monitored at an output line 334 where it is coupled as a selectable input to the system, via data selector 313, and is applied to an LED 336 on the front panel, indicating to the user the status of the data bit contained in the result register.

The instruction set for the CPU in this embodiment consists of 16 logic and control operations. These are sufficient to emulate any system described by a Boolean relationship.

CPU 330 may be programmed to activate its FLG F output at the end of a program to in turn, activate program counter reset circuitry. Here, program counter reset is provided either via the FLG F output from CPU 330, or via activation of a reset switch 340 and a logic gate 342. The output from logic gate 342 is a reset line 344.

CPU 330 is provided with clock control terminals X1, X2. With a front panel control switch 350 in the RUN position, a resistor pair 351, 352, in association with circuitry provided within CPU 330, defines the free running clock frequency. If switch 350 is placed in the "SINGLE STEP" position, pulses produced by activation of single step switch 360 and associated debounce circuitry 362 may be used to sequence operation of CPU 330.

CPU 330 may be programmed to activate a FLG 0 output. This signal is applied at the J input to a JK flip-flop 360. Applied at the K input to flip-flop 360, through inverter 362, is the "JMP" output from CPU 330. The FLG 0 and JMP outputs from CPU 330, in conjunction with the flip-flop 360, are used to address sets of inputs, and outputs, as will be understood from the discussion herein below.

The JMP output signal is used when an output is to be read back as an input, also explained below.

A write output W from CPU 330 is activated whenever a result from an operation performed by CPU 330 is to be written to an output. This results in activation of an output line 370, and an inverted output line 372.

Finally, CPU 330 has a reset input RST which is controlled by a logic gate 374. CPU 330 may be reset via the logic gate 374 either via a set reset flip-flop 380, or a reset line 382. The reset signal through set-reset flip-flop 380 is provided from the halt/reset pushbutton switch 384 provided on the control panel.

When RUN pushbotton switch 385 is pressed, flip-flop 380 activates a gate 386 allowing it to pass clock pulses provided out of a gate 388.

The high/low status of the clock signal out of gate 386 is monitored by a pair of LED's 390, 392, respectively, on the front panel.

The clock signal as coupled through gate 388 is either the single step pulse produced by switch 360 and circuit 362, or the CPU 330 internal free running clock signal, as inverted through buffer 390.

A D type flip-flop 392 is employed to synchronize a "JMP" signal from CPU 330 with the clock signal as provided out of gate 386. The Q output of flip-flop 392 is designated as a JMP signal whereas the $\overline{Q}$ output from gate 392 is designated a $\overline{JMP}$.

The FO, $\overline{FO}$, W and JMP signals are all selectively input to a series of logic gates 401–404. Gates 401–404 are used to activate a selected one of the input data selectors 310–313. Also supplied as a control input to gates 401–404 is a signal A3, and its inverted form, via inverter 406, $\overline{A3}$ The signal A3, as will be seen hereinbelow, corresponds to the A3 input/output address bus line.

The logic performed by gates 401–404 to selectively activate the input data selectors 310–313 is understood as follows.

Gate 401 activates data selector 311 in response to appropriate input signals:

W+A3+JMP+$\overline{FO}$.

Gate 402 activates input data selector 310 in response to appropriate input signals:

W+$\overline{A3}$+JMP+$\overline{FO}$.

Gate 403 activates data selector 313 in response to an appropriate signal:

W+A3+JMP+FO.

Finally, gate 404 activates data selector 312 in response to an appropriate input signal W+$\overline{A3}$+JMP+FO.

Thus, it is seen that gates 401–404 provide a means for the processor 330 to address a selected one of the input data selectors 310–313.

A series of output latches 421–424 are addressed in a similar manner. Thus, the address signals FO, $\overline{FO}$ A3 and $\overline{A3}$ are all routed to a series of logic gates 431–434. The outputs from logic gates 431–434 connect to the "CHIP ENABLE" inputs of the output latches 421–424, respectively, here preferably Motorola type MC 14599B integrated circuits. Thus, by appropriate addressing of the signals input to gates 431–434, the CPU 330 may address a selected output latch 421–424.

Fed to the data inputs of the output latches 421–424 is the data on the one-bit bidirectional data bus 320. Control inputs to latches 421–424 include the write signal W, a write disable signal WD, a reset signal, and a three line address bus 430. The three line address bus 430 originates from program memory, as will be described hereafter.

In operation, the CPU 330 addresses a selected one of the output latches 421–424 via appropriate signals on gates 431–434. The address at the address input A0–A2 of the latches 421–424, as supplied over input/output address line 430, causes the selected output latch 421–424 to latch the data on one-bit data line 320 to a selected output upon receipt of a suitable write signal $\overline{JMP}$ at write pin W. If, however, an appropriate $\overline{W}$ signal is received at the address WD input to a latch 421–424, this causes the latch to apply the signal appearing at the addressed output line Q1–Q7 to the bidirectional one-bit data bus 320, thereby providing a means for the system to couple an output line as an input. This, therefore, provides sequential logic processing capability as the present operation may be made dependent on the results of previous operations.

The outputs Q1–Q7 from output latch 421 each feed to a corresponding set of output jacks 440 and to the inputs of a series of inverters 442. The inverters 442 connect to a series of LED's 444 which, in turn, are in series with current limiting resistors 446 and a source of bias B+. Thus, when an appropriate output from latch 421 is activated, this signal is applied to one of the output jacks 440 and activates an appropriate LED from the LED set 444. The remaining output latches 422–424 connect to similar output jacks and LED's, as shown.

The system program counter is comprised of a string of three binary up counters 451–453. The binary counters 451–453 are, preferably, Motorola type MC 14516B integrated circuits.

A preset count may be loaded into counters 451–453 through a switch bank 455 which connects to a source of bias B+ through resistor sets 461–463.

Also supplied as control inputs to counters 451–453 are a preset enable "PE" signal from gate 342 on line 344, the clock signal, as provided out of gate 386, and the master reset signal, provided by the halt/reset switch 384.

Thus, in operation, a user suitably sets selectd switches in switch bank 455 to determine the preset count in counters 451–453. This preset value is then entered in the counters upon receipt of a preset enable signal, from SET PROGRAM COUNTER switch 340 or the FLG F signal from CPU 330. The counters thereafter are incremented at the clock rate, whether the clock be single stepped or in the free running mode. The halt/reset switch 384 returns the counters to zero regardless of the setting of preset switch bank 455.

The output from program counters 451–453 comprises an 11 line memory address bus 470, capable of addressing up to 2,048 addresses. The status of these addresses are displayed to a user via an LED bank 472, as driven through an inverter bank 474 and coupled to a source of bias B+ through resistor bank 476. Thus, the LED indicators 472 display to a user the present status of the memory address bus 470.

The memory address bus 470 is also applied to the address inputs of program memory. Here, program memory is comprised of parallel random access memories RAM's 480, 482, preferably comprised of standard type 2114 4×1K type integrated circuits, or Erasable Programmable Read Only Memory (EPROM) 484, here comprised of a standard type 2716 2K×8 integrated circuit. A switch 486 selects, in its open position, the EPROM 484 through inverter 488 and the Chip Select S)/ input to EPROM 484. With switch 486 closed, RAMS 480, 482 are selected via logic gate 490 and the RAM select input S.

Data may be loaded into the RAM 480, 482 via activation of a switch 500, which is ganged with a switch set 502. Upon activation of switch 500 to the "LOAD" position, a signal is applied through associated logic 506 which activates the RAM 480, 482 into its write mode. The user may then, via programming switch bank 510, and resistor bank 512, connected to a source of bias B+, program in suitable operational codes and input/output addresses. The address within the RAM 480, 482 for these instructions is determined by the signal on the memory address bus 470 provided by the program counter chain 451–453. The user then activates the single step switch 360 to load the value into RAM and prepare for the next instruction. By repeating these steps, the full program may be loaded within the RAM. The output lines from RAM 480, 482 are tied together to the output lines from the EPROM 484 to form the instruction, input/output address bus, indicated generally at 490. The first three data lines A0-A2 from bus 490 are used to address selected inputs of input data selectors 310-313, and selected output latches 421-424. The fourth line A3 of data bus 490 provides the A3 addressing signal as discussed above. The remaining four data lines 10-13 provide the instruction code to the CPU 330 over bus 332.

The status of the memory data bus 490 is displayed to the user via LED set 520 which is driven by inverters 522 and connectd to a source of bias B+ through resistors 524.

Thus, the circuit of FIGS. 4A-4G allows a user to emulate the response of a Boolean network system by programming the Boolean relationships between inputs and outputs, providing selected inputs at input jacks or switches, and monitoring the result at selected outputs. By providing a means to use a resultant output signal as a subsequent input, the system allows for sequential logic operation.

In summary, an improved method for emulating the response characteristic of a Boolean network system has been described in detail. The method is both simple and accurate to use, and provides a convenient means to diagnose and analyze complex systems which cannot be practicably analyzed by traditional means such as maps or truth tables.

While a preferred embodiment of the invention has been described in detail, it should be apparent that many modifications and variations thereto are possible, all of which fall within the true spirit and scope of the invention.

For example, contemplated modifications include:
1. program memory expansion,
2. input/output expansion,
3. use of external circuitry to provide analog interfaces such as time delays, or
4. portable (battery) operation.

The embodiments of the invention in which an exclusive property or privilege is claimed are defined as follows:

1. A method for emulating a Boolean network system having a plurality of input variables and a plurality of logic controlled outputs, the method comprising the steps of:
   (a) providing a plurality of inputs, each input adapted to be identified with a user selected one of the input variables to the Boolean network system, each input further adapted to assume a user selected logic state, said step comprising the steps of:
      (i) providing each input as a manually controlled switch;
      (ii) providing circuitry in association with each switch such that the switch is user operable to produce either a low or a high logic level signal; and,
      (iii) providing a visual display for identifying to a user the Boolean network input variable each switch represents;
   (b) providing a plurality of output indicators, each output indicator adapted to be identified with a user selected one of the logic controlled outputs of the Boolean network, each indicator providing an indication of the logic state applied thereto; and
   (c) providing logic control means, said logic control means being programmable by a user to define a Boolean functional relationship between the user selected inputs and outputs such that the logic control means responds to the user selected logic states at the selected inputs to apply appropriate states to the selected outputs in accordance with a programmed Boolean functional relationship.

2. The method of claim 1 wherein step (a) comprises the further step of:
   (iv) providing as a user selected input, the logic state applied at a user selected one of the output indicators, and
   wherein step (c) comprises the step of:
   (i) providing said logic control means with means for programming sequential logic functional relationships,
   whereby a Boolean network having sequential logic may be emulated.

3. The method of claim 1 wherein step (a) comprises the further steps of:
   (iv) providing an input jack associated with each switch; and,
   (v) providing a means for setting each switch to a position such that the logic level at the corresponding input is determined by a signal coupled to the associated jack.

4. The method of claim 1 wherein step (b) comprises the further steps of:
   (i) providing each output indicator as a light emitting device; and,
   (ii) providing circuitry in association with each light emitting device such that said device emits light as a predetermined function of the logic state applied thereto.

5. The method of claim 4 wherein step (b) comprises the further step of:
   (iii) providing a visual display for identifying to a user the Boolean network logic controlled output each light emitting device represents.

6. The method of claim 4 wherein step (b) comprises the further step of:
   (iii) providing an output jack associated with each light emitting device such that the logic state appearing at said device is also applied to the associated output jack.

7. The method of claim 5 wherein step (b) comprises the further step of:
   (iv) providing an output jack associated with each light emitting device such that the logic state appearing at said device is also applied to the associated output jack for interfacing with external circuitry.

8. The method of claim 1 wherein step (c) comprises the steps of:
   (i) providing a memory storage device, and
   (ii) providing a user controlled means for storing multiple programs, each representing a unique Boolean functional relationship, in said memory storage device.

9. The method of claim 8 comprising the further step of:
   (iii) providing user controlled means to edit a stored program.

* * * * *